United States Patent
Barbist et al.

(12) 
(10) Patent No.: US 6,214,474 B1
(45) Date of Patent: *Apr. 10, 2001

(54) OXIDATION PROTECTIVE COATING FOR REFRACTORY METALS

(75) Inventors: Roland Barbist, Wängle; Wolfram Knabl, Reutte; Hans-Peter Martinz, Hofen; Peter Rodhammer, Reutte, all of (AT)

(73) Assignee: Plansee Aktiengesellschaft, Reutte/Tirol (AT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,123
(22) PCT Filed: Nov. 19, 1997
(86) PCT No.: PCT/AT97/00251
   § 371 Date: Oct. 26, 1998
   § 102(e) Date: Oct. 26, 1998
(87) PCT Pub. No.: WO98/23790
   PCT Pub. Date: Jun. 4, 1998

(30) Foreign Application Priority Data

Nov. 22, 1996 (AT) .................................................. 687/96 U

(51) Int. Cl.⁷ ........................................................ B32B 9/00
(52) U.S. Cl. .......................... 428/469; 428/472; 428/701; 428/702; 428/937
(58) Field of Search .................................. 428/469, 472, 428/632, 639, 640, 641, 697, 701, 702, 704, 937

(56) References Cited

U.S. PATENT DOCUMENTS

| | | | |
|---|---|---|---|
| 2,683,305 | 7/1954 | Goetzel .................................. 29/198 |
| 3,837,894 | * 9/1974 | Tucker ............................... 117/70 A |
| 4,282,289 | 8/1981 | Kullander et al. ................... 428/457 |
| 4,399,168 | 8/1983 | Kullander et al. ................. 427/255.7 |
| 4,603,056 | 7/1986 | MacKinnon et al. ................... 427/38 |
| 4,745,010 | 5/1988 | Sarin et al. ........................... 427/255 |
| 4,889,776 | 12/1989 | Priceman ............................. 428/629 |
| 4,898,487 | 2/1990 | Brull et al. ........................... 400/354 |
| 4,927,714 | 5/1990 | Priceman ............................. 428/628 |
| 4,942,732 | 7/1990 | Priceman ............................... 60/261 |
| 5,246,787 | * 9/1993 | Schultz et al. ....................... 428/469 |
| 5,389,454 | * 2/1995 | Wood et al. .......................... 428/641 |
| 5,756,223 | 5/1998 | Cameron et al. ..................... 428/688 |

FOREIGN PATENT DOCUMENTS

| | | |
|---|---|---|
| 222349 A1 | 5/1985 | (DE) . |
| 37 41 292 A1 | 6/1989 | (DE) . |
| 199 307 A1 | 10/1986 | (EP) . |
| 0 223 104 | * 5/1987 | (EP) . |
| 0 304 176 B1 | 2/1989 | (EP) . |
| 0 679 733 A2 | 11/1995 | (EP) . |
| 1043579 | 9/1966 | (GB) . |

OTHER PUBLICATIONS

E. M. Passmore et al., Selection of Diffusion Barriers for Use in Protective Coating System for Tungsten and Molybdenum, *Metallurgical Society Conferences,* XP002061533, pp. 681–692, Abstract 2, p. 683, London, GB, 1966 (No Month).

Prokoshkin, D.A. et al., Plasma Coatings Made From Molybdenum Disilicide for Niobium and its Alloys, XP–002061534, *Chemical Abstracts,* vol. 92, No. 24, Columbus, Ohio, US, 1992 (No Month).

Suwa Seikosha KK, Corrosion Resistance Ornament Article Wrist Watch Part Metal Alloy Layer Coating Metal Silicide Layer Improve Adhesive Characteristic, XP002061535 & JP 55 006 426 A, WPI, *Derwent Publications LTD.,* London, GB, 1980 (No Month).

Chemical Abstracts, vol. 92, No. 24. Prokoshkin, D. A. et al. "Plasma coatings made from molybedenum disilicide for niobium and its alloys" Jun. 18, 1980.*

E.M. Passmore, et al. "Selection of diffusion barriers for use in protective coating systems for tungsten and molybdenum" Metallugical Society Conferences, Bd. 30, 1966 (No Month).*

* cited by examiner

Primary Examiner—Deborah Jones
Assistant Examiner—Bryant Young
(74) Attorney, Agent, or Firm—Morgan & Finnegan, LLP

(57) ABSTRACT

The invention relates to a parent substance consisting of a high-melting point metal and an oxidation protective coating made of silicides or aluminides. In accordance with the invention, a reaction barrier layer is placed between the parent substance and the oxidation protective coating, and the oxidation protective coating is alloyed with one or more metals selected from group consisting of molybdenum, niobium, tantalum, and hafnium in a total proportion of 2 to 35 at. %.

7 Claims, No Drawings

OXIDATION PROTECTIVE COATING FOR REFRACTORY METALS

The invention concerns a body, of a high-melting metal base such as chromium, molybdenum, tungsten, tantalum, niobium, and their alloys or composite materials and an oxidation protective layer of silicides or aluminides.

High-melting metals have the characteristic of retaining their strength up to the highest temperatures. However, it is problematic that these metals and alloys have only a low resistance with respect to oxidation, if they are exposed to air or other oxidizing media at high temperatures of over 400° C.

In order to improve this strong susceptibility to oxidation, a method is known for providing the surface of the high-melting metals with corresponding protective layers. For many uses, the application of coatings of silicides or aluminides has proved good.

U.S. Pat. No. 3,540,863 describes, for example, CrFe silicide layers as an oxidation protective layer for a basic material made of niobium or niobium base alloys.

Such coatings are melted by a diffusion annealing treatment after the application. This dead melting is the unavoidable prerequisite for the diffusion annealing of the layer component and for the production of the required barrier of the layer to oxygen permeation in these silicide or aluminide layers, which nowadays are almost exclusively applied by dross coating or plasma spraying.

By this diffusion annealing treatment, the layer composition is modified by dissolving the base material and incorporating the base material components into the coating, and multiphase and multilayer oxidation protective coatings are formed, which have one or more layers of intermetallic phases at the interface of the nondissolved base material; according to current teaching, the phases have an advantageous effect on the layer adhesion of the oxidation protective layer.

The disadvantage, on the one hand, is that dissolution of the components of the base material inevitably takes place, whether the components have a positive or negative influence on the function of the oxidation protective layer; and on the other hand, that diffusion processes which transfer the fractions of the basic material into the oxidation protective layer continue even during the proper high-temperature use of the coated base body. In the oxidation layer, these processes, however, are undesired in any case, since they change the chemical and physical behavior of layer and continuously worsen its lifetime and its composite with the base material.

European Patent No. A2 0,304,176 describes an object provided with an oxidation protective layer and which is made of a high-melting metal, which is provided with a melted silicide layer, for example, with the composition 20% Cr, 20% Fe, remainder Si. In order to increase the thermal load capacity in the use of the coated object, the oxidation protective layer is provided with an external ceramic layer, which fulfills the function of a thermal barrier.

Such a measure does not have the effect of preventing the uncontrolled dissolution processes between the base material and oxidation protective layer during use.

In isolated cases, objects with oxidation protective layers have also become known which have a reaction barrier layer between the base material and oxidation protective layer. Such layer structures have been accepted, however, in actual practice only in very special fields of application (for example, in the glass industry) and there, in turn, only for very special applications and in combination with an oxidation protective layer made of metal or an alloy of the platinum group, as, for example, described in United Kingdom Patent No. 1,195,349.

The object of the invention under consideration, therefore, is to create an article comprised of a base body made of a high-melting metal and an oxidation protective layer made of silicides or aluminides, wherein the layer is optimized with regard to use, independent of the composition of the base material. At the same time, dissolution processes of the base material in the oxidation protective layer or vice versa, uncontrolled in such an object, are to be ruled out during the production of the coated component and during use.

In accordance with the invention, this is attained in that a reaction barrier layer is placed between the base body and the oxidation protective layer and that the oxidation protective layer is alloyed with one or more metals from the group molybdenum, niobium, tantalum, and hafnium in a total fraction of 2–35 at. %.

Thus, the invention goes a completely new way in that it prevents the unavoidable incorporation of high-melting metals from the base material in a concentration prespecified from the process technology and from use and which changes according to the temperature, by the placement of a reaction barrier layer, but instead purposefully incorporates high-melting metals, in the optimized concentration, in the oxidation protective layer, so as to obtain, as before, the advantages of these metals in the oxidation layer and, at the same time, to reliably prevent an uncontrollable dissolution and diffusion of these metals from the basic material during production and during use.

In this way, on the one hand, a composition of the oxidation protective layer, independent of the basic material and the production process, can be attained and, on the other hand, a continuous, cyclic change of the composition of the oxidation protective layer can be prevented during changing temperature loads or over very long periods of time with constant temperatures.

In particular, a continuous formation of brittle, intermetallic phases, uncontrolled during use, at the base material/oxidation protective layer transition zone, which bring about a reduction in the thickness of the effective oxidation protective layer, is stopped. Also a critical embrittlement of the base material/oxidation protective layer composite, which is frequently the cause of reduced service lives, is thereby prevented in the long term.

By preventing the reaction of layer components with the base material and diffusion of layer components into the base material, service lives with constant characteristics of the layer system in the composite zone are attained, which are considerably longer, with comparatively thinner protective layers.

"Silicides" are understood to be, in particular, alloys based on silicon with at least 60 at. % Si and 5–40 at. % of one or more elements from the group Cr, Fe, Ti, Zr, Hf, B, and C and "aluminides," in particular, alloys based on aluminum with at least 60 at. % Al and 5–40 at. % of one or more elements from the group Si, Cr, Ti, Zr, Hf, Pt, B, and C.

The selection of the metal or metals, with which the oxidation protective layer is alloyed, in accordance with the invention, is based not only on the minimization of the cinder constant, but rather also on the usage conditions with regard to the steady-state or cyclical temperature load. Also the thermal expansion coefficients of the base body under consideration have to be taken into consideration in the selection.

As a rule, an optimal adaptation of the thermal expansion coefficients of the base material, reaction barrier layer, and oxidation protective layer substantially increase the temperature change resistance of the individual composite object.

Depending on the application case, an alloying of the same metal that the base body is essentially made of (for example, SiCrFe oxidation protective layer, alloyed with niobium, in a base body of niobium or a niobium base alloy) or the alloying of another metal (for example, SiCrFe layer, alloyed with molybdenum, in a base body of niobium or a niobium base alloy) produce the best service life results in use.

The essential advantage attained by the invention is that the user is no longer restricted to the automatically resulting alloy formation of the oxidation protective layer with very specific fractions of the basic material in accordance with the state of the art, and the possibility exists of optimizing the oxidation protective layer with freely selectable alloy fractions, taking into consideration the pertinent special usage conditions.

In particular, oxidic layers, such as $Y_2O_3$, $HfO_2$, $ZrO_2$, $La_2O_3$, $TiO_2$, $Al_2O_3$, but also carbidic or nitridic layers, such as HfC, TaC, NbC, or $Mo_2C$ or TiN, HfN, or ZrN, are suitable as reaction barrier layers. The selection of the layer system, the layer thickness, and the coating method are based on the material and dimensions of the components to be protected, on the one hand, and the usage conditions, on the other hand.

The basic prerequisite for the successful use of the idea in accordance with the invention is that the thermal cycle capacity which is characteristic for the material oxidation protective layer systems in accordance with the invention is reduced by the reaction barrier layer in a nonusage-relevant manner. Therefore, one has to consider an optimized adaptation of the thermal expansion coefficients of the basic material and the barrier layer. Also, the presence of a residual porosity, as is, for example, present in thermally sprayed layers, as a rule, and the thus produced pseudoplasticity, can also have an advantageous effect on the composite behavior. The layer thicknesses of the reaction barrier layers are, as a rule, 5–20 μm for completely dense layers or 20–100 μm for layers with residual porosity.

Basically, all known coating methods can be taken into consideration for the deposition of the reaction barrier layer, such as chemical vapor deposition, physical vapor deposition, or the plasma spraying of powders. With regard to thermal cycle capacity, atmospheric plasma spraying, for example, of $HfO_2$ or $ZrO_2$, has proved particularly good. The reaction barrier layer, however, can also be formed by a reaction of components deposited first (for example, carbon) with the basic material (for example, to carbides) or by the reaction with a reactive gas phase (for example: $CH_x, N_2$) to a carbide or nitride of the basic material. The oxidation protective layer itself can also be deposited with all coating methods otherwise common for this, with the exception of pack cementing. Thermal spraying of the reaction barrier layer and the oxidation protective layer in immediately successive operations offer process-technological advantages.

It has proved particularly good if the oxidation protective layer is alloyed with one or more metals of the group molybdenum, niobium, tantalum, and hafnium in a total fraction of 15–25 at. %.

If the base body is made of tantalum or niobium or their alloys or composite materials, oxidation protective layers made of silicides or aluminides which are alloyed with 15–25 at. % molybdenum have proved particularly good.

For the reaction barrier layers, in particular oxide layers and very particularly, zirconium oxide or hafnium oxide layers have proved to be particularly advantageous. Atmospheric plasma spraying has proved to be a particularly preferred method for the application of these reaction barrier layers.

The invention will be explained in more detail below with the aid of a production example:

EXAMPLE

A rodlike specimen made of Nb base alloy Nb10W2.5Zr was coated on all sides with a reaction barrier layer made of $HfO_2$ with a thickness of approximately 50 μm by means of atmospheric plasma spraying. In a subsequent operation, a modified silicide layer (Si15Cr15Fe20Mo) was deposited on this reaction barrier layer by means of atmospheric plasma spraying also. The silicide layer thus obtained was subsequently over melted at 1250° C. in a vacuum (holding time: 15 min). As a reference, a sample without a reaction barrier layer was produced in an analogous manner. In a subsequent oxidation test (1300° C.; 30 min, holding time; 40 cycles between 200° C. and holding temperature, the sample with the molybdenum-alloyed silicide layer and the reaction barrier layer exhibited a specific weight increase of 1.4 mg/cm². The measured reference value of the sample without the reaction barrier layer was 3.2 mg/cm². A sample with 10% Mo in the layer material, but without the reaction barrier layer, prepared for the purpose of differential diagnosis, initially exhibited an oxidation behavior which was also improved in comparison to the standard, but after the 15th cycle, rapidly approximated the weight increase curve of the standard sample.

In another oxidation test, the long-term behavior was tested in air, with a constant temperature load. After 500 h storage, metallographic analyses carried out at 1300° C. show that in the case of the protective layer in accordance with the invention, the passivating, oxidic cover layer formed in the test is produced more uniformly than in the case of the sample without a reaction barrier layer, with a substantially lower surface roughness.

After 500 h test duration, 55 μm of the originally 100 μm silicide layer thickness are still available as sacrifice material for the further growth of the passivating oxide layer. In the case of the sample without the reaction barrier layer, the remaining thickness of the sacrifice layer declined to 25 μm, under the same conditions, as a result of the irregular passivating layer, on the one hand, and the reaction of silicon—to a lesser extent, Cr and Fe, to Nb-based silicides. For the prognosis of the lifetime of the individual components, this result signifies a lifetime advantage of the sample coated in accordance with the invention of more than 100%.

What is claimed is:

1. An article comprised of a base body comprised of a high-melting metal selected from the group consisting of chromium, molybdenum, tungsten, tantalum, niobium, and their alloys or composite materials and an oxidation protective layer comprised of silicides or aluminides, wherein the silicides comprise at least 60 at. % silicon and 5–40 at. % of one or more elements selected from the group consisting of chromium, iron, titanium, zirconium, hafnium, boron and carbon, and the aluminides comprise at least 60 at. % of aluminum and 5–40 at. % of one or more elements selected from the group consisting of silicon, chromium, titanium, zirconium, hafnium, platinum, boron and carbon, and wherein a reaction barrier layer is placed between the base body and the oxidation protective layer and the oxidation protective layer is alloyed with one or more metals selected from the group consisting of molybdenum, niobium, tantalum, and hafnium in a total fraction of 2–35 at. %.

2. The article according to claim 1 wherein the oxidation protective layer is alloyed with one or more metals selected from the group consisting of molybdenum, niobium, tantalum, and hafnium in a total fraction of 15–25 at. %.

3. The article according to claim 1 wherein the base body is comprised of tantalum or niobium or their alloys or composite materials and that the oxidation protective layer is alloyed with 15–25 at. % molybdenum.

4. The article according to claim 1 wherein the reaction barrier layer is comprised of an oxide layer.

5. The article according to claim 4 wherein the oxide layer is a zirconium oxide or a hafnium oxide layer.

6. The article according to claim 1 wherein the reaction barrier layer has a layer thickness between 40–60 $\mu$m.

7. The article according to claim 6 wherein the reaction barrier layer is applied by atmospheric plasma spraying.

* * * * *

UNITED STATES PATENT AND TRADEMARK OFFICE
CERTIFICATE OF CORRECTION

PATENT NO. : 6,214,474 B1
DATED : April 10, 2001
INVENTOR(S) : Roland Barbist *et al.*

It is certified that error appears in the above-identified patent and that said Letters Patent is hereby corrected as shown below:

Title Page

Item [73] Assignee, please delete "Plansee Aktiengesellschaft, Reutte/Tirol (AT)" and insert therefor -- Schwarzkopf Technologies Corporation, New York, NY --.

Signed and Sealed this

Tenth Day of July, 2001

*Attest:*

*Attesting Officer*

NICHOLAS P. GODICI
*Acting Director of the United States Patent and Trademark Office*